US009453334B2

(12) United States Patent
Gross et al.

(10) Patent No.: US 9,453,334 B2
(45) Date of Patent: Sep. 27, 2016

(54) METHOD AND DEVICE FOR PRODUCING A LOW-EMISSIVITY LAYER SYSTEM

(75) Inventors: Harald Gross, Langebrueck (DE); Udo Willkommen, Dresden (DE)

(73) Assignee: VON ARDENNE GMBH, Dresden (DE)

( * ) Notice: Subject to any disclaimer, the term of this patent is extended or adjusted under 35 U.S.C. 154(b) by 159 days.

(21) Appl. No.: 14/237,951

(22) PCT Filed: Aug. 20, 2012

(86) PCT No.: PCT/EP2012/066172
§ 371 (c)(1),
(2), (4) Date: Feb. 10, 2014

(87) PCT Pub. No.: WO2013/026817
PCT Pub. Date: Feb. 28, 2013

(65) Prior Publication Data
US 2014/0199496 A1 Jul. 17, 2014

(30) Foreign Application Priority Data

Aug. 19, 2011 (DE) .................. 10 2011 081 281
Jan. 18, 2012 (DE) .................. 10 2012 200 665

(51) Int. Cl.
*B05D 3/06* (2006.01)
*B05D 5/06* (2006.01)
(Continued)

(52) U.S. Cl.
CPC ............. *E04B 1/78* (2013.01); *C03C 17/06* (2013.01); *C03C 17/36* (2013.01); *C03C 17/366* (2013.01); *C03C 23/001* (2013.01);
(Continued)

(58) Field of Classification Search
CPC .. C23C 14/14–14/205; C23C 214/43–14/358; C23C 14/58; C23C 14/5806; C23C 14/5813; C03C 17/06; C03C 17/09; C03C 17/22; C03C 17/225; C03C 17/23–17/27; C03C 17/36; C03C 17/3602; C03C 17/3657; C03C 17/366; C03C 23/001–23/0025; C03C 2218/15; C03C 2218/151; C03C 2218/154–2218/156; C03C 2218/32
USPC ........ 427/553–554, 557–559, 566, 591, 593, 427/250–253, 163.1, 164, 166
See application file for complete search history.

(56) References Cited

U.S. PATENT DOCUMENTS 6,890,870 B2 * 5/2005 Karasawa ........... H01L 29/6675
257/66
9,343,313 B2 * 5/2016 Fuse ................... H01L 21/2686
(Continued)

FOREIGN PATENT DOCUMENTS

| DE | 102006047472 A1 | 4/2008 |
| DE | 102009033417 A1 | 7/2009 |
| WO | 2011066256 A1 | 6/2011 |

OTHER PUBLICATIONS

International Search Report for PCT/EP2012/066172 dated Nov. 26, 2012.

*Primary Examiner* — Marianne L Padgett
(74) *Attorney, Agent, or Firm* — Heslin Rothenberg Farley & Mesiti P.C.

(57) ABSTRACT

A method for producing a low-emissivity layer system includes the steps of forming at least one low emissivity layer on at least one side of the substrate by deposition, and subsequent brief tempering of a deposited low emissivity layer by electromagnetic radiation, avoiding an immediate heating up of the substrate. A device for performing the method includes a flash lamp arrangement.

15 Claims, 2 Drawing Sheets

(51) Int. Cl.
    *E04B 1/78*     (2006.01)
    *C23C 14/14*     (2006.01)
    *C23C 14/58*     (2006.01)
    *C03C 23/00*     (2006.01)
    *C03C 17/36*     (2006.01)
    *C03C 17/06*     (2006.01)

(52) U.S. Cl.
    CPC ...... *C03C 23/0015* (2013.01); *C03C 23/0025* (2013.01); *C23C 14/14* (2013.01); *C23C 14/5806* (2013.01); *C03C 2218/32* (2013.01)

(56) References Cited

U.S. PATENT DOCUMENTS

| | | |
|---|---|---|
| 2003/0039842 A1 | 2/2003 | Nakashima et al. |
| 2004/0104481 A1 | 6/2004 | Ong |
| 2007/0234949 A1 | 10/2007 | Ahn et al. |
| 2008/0169064 A1 | 7/2008 | Samukawa et al. |
| 2009/0121157 A1* | 5/2009 | Moffatt ............ H01L 21/268 250/492.2 |
| 2009/0263944 A1* | 10/2009 | Chin ............ H01L 21/26513 438/199 |
| 2010/0071810 A1* | 3/2010 | Nadaud ............ C03C 17/09 148/400 |
| 2010/0098874 A1* | 4/2010 | Schroder ............ C23C 18/1601 427/532 |
| 2012/0021149 A1* | 1/2012 | Myli ............ C03C 17/3411 428/34 |
| 2012/0156827 A1* | 6/2012 | Michael ............ H01L 21/428 438/95 |
| 2014/0272465 A1* | 9/2014 | Lienhart ............ C03C 17/36 428/673 |
| 2016/0060163 A1* | 3/2016 | Burrows ............ C03C 17/3423 428/34 |
| 2016/0060948 A1* | 3/2016 | Burrows ............ E06B 3/6715 428/34 |
| 2016/0060949 A1* | 3/2016 | Burrows ............ E06B 3/6722 428/34 |

* cited by examiner

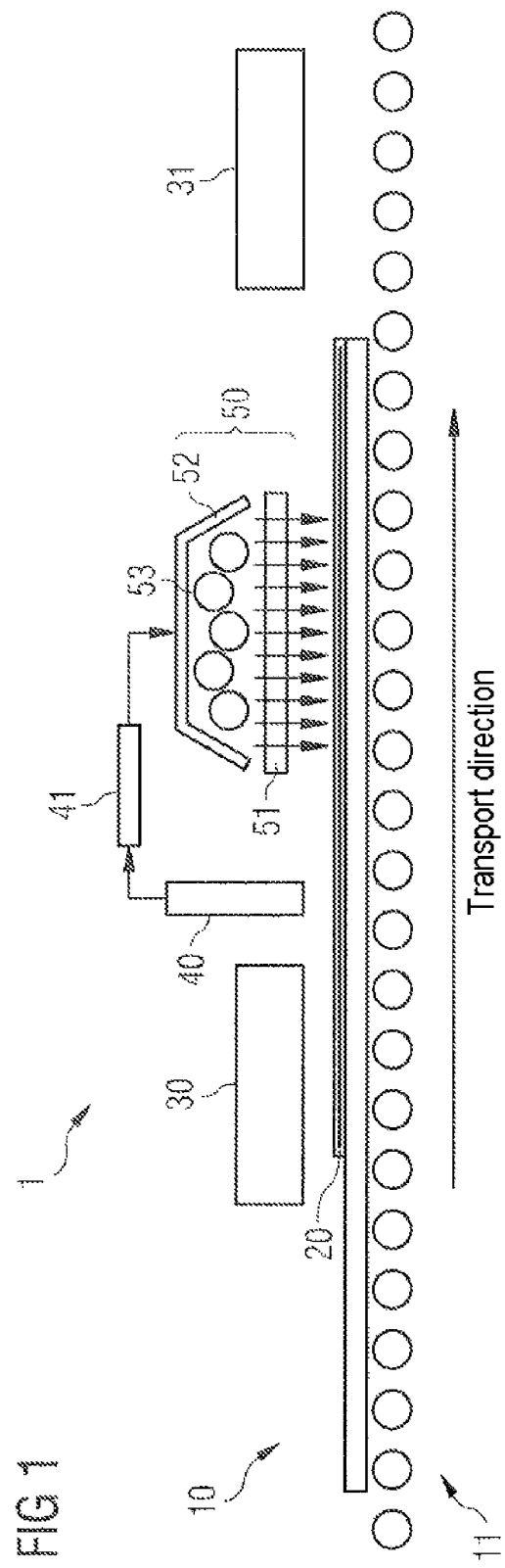

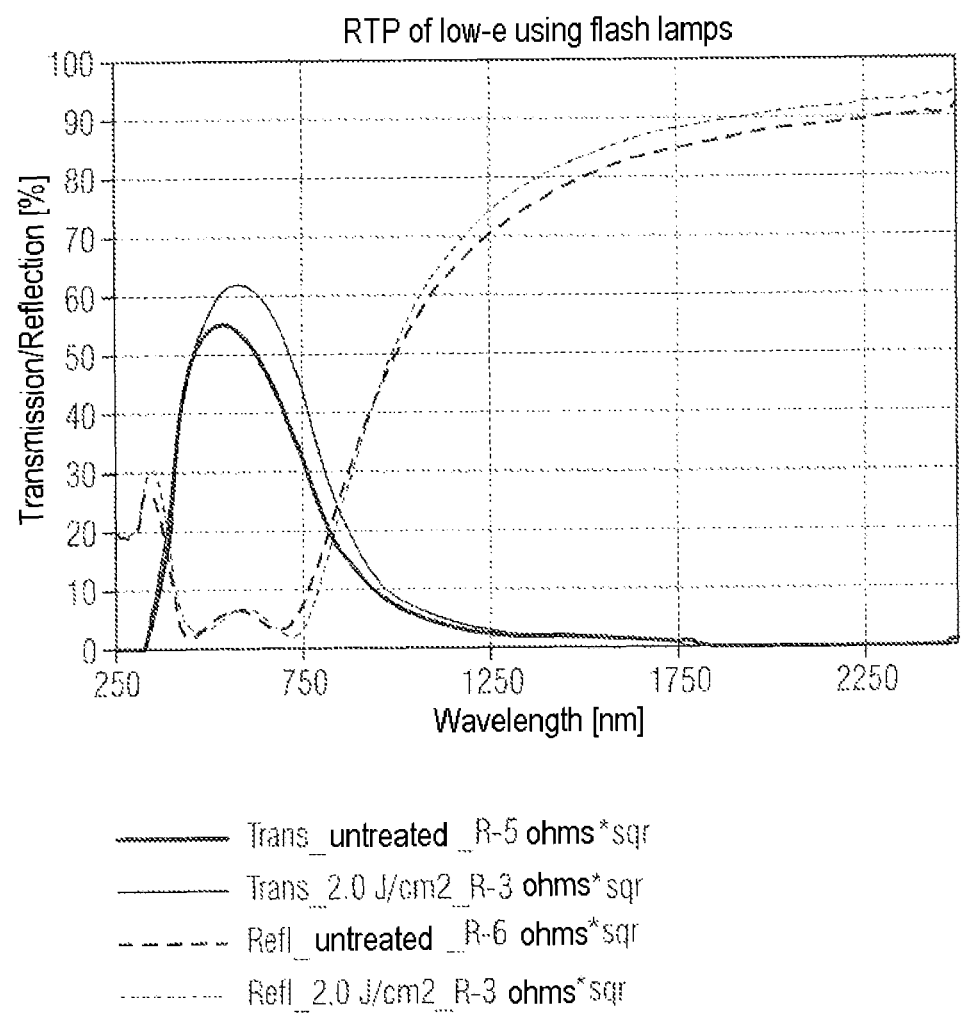

METHOD AND DEVICE FOR PRODUCING A LOW-EMISSIVITY LAYER SYSTEM

CROSS REFERENCE TO RELATED APPLICATIONS

This application is a national stage filing under section 371 of International Application No. PCT/EP2012/066172 filed on Aug. 20, 2012, and published in German on Feb. 28, 2013 as WO 2013/026817 A1 and claims priority of German patent application No. 10 2011 081 281.4 filed on Aug. 19, 2011, and German patent application No. 10 2012 200 665.6 filed on Jan. 18, 2012, the entire disclosure of these applications being hereby incorporated herein by reference.

BACKGROUND ART

The invention relates to a method for producing, in particular tempering, a low-emissivity layer system, and a device for carrying out the method.

The invention relates to the production, in particular to the tempering, of low-emissivity, thin layers, e.g. silver layers, which are used in the field of thermal insulation of window and façade glasses. The specific low-emissivity coatings, also called low-e coatings for short, are used for reducing heat transfer. The low-e coating is distinguished by the fact that it has a low thermal emissivity and the coating is moreover largely transparent in the visible spectral range. With the thermally insulating coatings the aim is to ensure, on the one hand, that the solar radiation can pass through the pane and heat the building, while only little heat at room temperature is emitted from the building to the environment. In a further application, the low-e coating is intended to prevent an energy input from the outside toward the inside.

The coatings used for this purpose comprise for example transparent, metallic systems, in particular silver-based multilayer systems, which have a low emissivity and thus a high reflection in the infrared range of light, in conjunction with a high transmissivity of the entire layer system in the visible spectral range. The metallic layers usually used are used with such a thickness with which they still have the required transparency. For example, silver up to a thickness of 20 nm is still regarded as transparent. The transparent metallic layers having high reflection in the IR range are generally designated as IR reflection layers, for differentiation.

By contrast, glass and other nonmetallic substrate materials generally have a high emissivity in the infrared spectral range. This means that they absorb a high proportion of the thermal radiation from the environment and at the same time, according to their temperature, also emit a large amount of heat to the environment.

The method used for producing a low-e coating of the substrate is generally a vacuum method, such as evaporation methods or sputtering technology. However, these thin layers usually cannot be deposited ideally conformally and tend toward dewetting, which results in a corrugated, i.e. non-uniform, layer thickness distribution. However, this energetic limitation of growth can be partly compensated for by the top layers, with the result that diffusion processes and the leveling of the silver layers occur during a downstream temperature increase. This results from the shift in the surface energy equilibrium in favor of a wetted configuration. These layers having a homogeneous thickness are distinguished by a corresponding decrease in the sheet resistance and afford the advantage of increased reflection in the infrared range of light and thus a reduced emissivity.

This effect is known from the production of safety glass. The customary procedure for this purpose, in a so-called tempering process, is for the already coated glasses to be greatly heated above their softening point, typically to 680-720° C., and then rapidly cooled and thus thermally prestressed. However, since this means additional costs, the panes processed to form safety glass are generally only those for which this is prescribed for their use. A large proportion of the panes remain untreated in this regard. In the course of this heat treatment process, however, the optical properties of the multilayer system, such as e.g. the reflection color or transmission, in particular in the visible range of the electromagnetic spectrum, also change as a result of temperature-dictated diffusion processes and chemical reactions. These changes are disadvantageous, however, since untreated and treated panes are installed alongside one another for cost reasons, with optical differences being extremely disturbing. According to the prior art, therefore, attempts are made to fashion the low-e layer systems in such a way that the changes in the optical and thermal layer properties on account of the heat treatment of the coated substrate remain minimal, at least in a range such that visually no difference can be ascertained.

Subsequently, these thermally prestressed substrates are no longer configurable. That means that, in contrast to what is customary for glass, they can no longer be shaped by means of scribing and breaking or mechanically processed in some other way. Furthermore, microscopic defects such as microcracks in panes treated in this way can lead to spontaneous cracking. In order to prevent this risk, said panes for specific applications have to be subjected to a heat soak test, i.e. a test involving the heat soak process for single-pane safety glass.

In order to ensure the configurability of the glass, endeavors are made, in RTP, to heat only the functional layer, i.e. the low-e layer, alone, without changing the substrate. The term "RTP" ("rapid thermal processing") is taken to mean a rapid thermal treatment. The prior art discloses in this respect experiments with lasers, for example from the document WO 2010/142926 A1, which operate in the near infrared range, called IR range below. In addition to the relatively far IR range, the low-e layers absorb sufficiently well in the UV range, too. For both absorption ranges of the low-e layer system, however, the use of linear lasers comprising semiconductor diodes for brief tempering is very cost-intensive, which is disadvantageous.

BRIEF SUMMARY OF INVENTION

The invention is therefore based on the object of providing an efficient method for producing, in particular for tempering, a low-emissivity layer system on at least one side of the substrate, which improves the optical and thermal properties of the low-emissivity layer system without expensive heat treatment of the entire substrate and with the configurability thereof being maintained. In this case, the method is intended to be cost-effective and the throughput is intended to be increased. Furthermore, the intention is to provide a device suitable for carrying out the method according to the invention.

According to the invention, after the deposition of at least one low-emissivity layer system on at least one side of the substrate, at least one transparent metallic IR reflection layer of a low-emissivity layer system, designated here as low-emissivity layer, is briefly heated by means of electromagnetic radiation while avoiding immediate heating of the substrate, in a brief tempering step. In this case, the electromagnetic radiation is effected at an emission wavelength at which it is at least partly absorbed by the deposited low-emissivity layer and converted into heat. In this case, the emission wavelength of the electromagnetic radiation in the brief tempering step is preferably set or adapted to the material of the low-emissivity layer in such a way that the emission wavelength of the electromagnetic radiation is realized in its absorption range.

As a result of the absorption of the electromagnetic radiation, the low-emissivity coating is tempered to a specific temperature and thus restructured in such a way that its properties, in particular the thermal, electrical and/or optical properties, change, wherein for example in comparison with the low-emissivity layer before the brief tempering, its sheet resistance decreases and, if appropriate, its transmission in the visible range or reflection in the infrared also increases.

Preferably, the electromagnetic radiation for brief tempering is set in such a way that the low-emissivity layer which is tempered by electromagnetic radiation has layer properties, in particular optical and/or thermal layer properties, comparable or identical to those of the conventionally tempered low-emissivity layer of a safety glass. The wording "the conventionally tempered low-emissivity layer of a safety glass" is taken to mean tempering in the process for processing a glass to form the safety glass. In this case, it has been found that in the case of a thermal treatment—carried out after the deposition—of the low-e layer deposited on the substrate by means of the electromagnetic radiation adapted to the material properties of the low-e layer, a significant reduction in the sheet resistance of the coating and, in a manner correlating therewith, a decrease in the emissivity, i.e. the heat emission, by up to 30% occur. The optical properties, such as reflection colors and transmission, also change in the manner that would also be the case in a conventional thermal treatment. The major advantage is, moreover, that, on account of the low heat capacity of the low-emissivity coating, separate cooling of the coated substrate does not become necessary and the substrate is not processed to form safety glass during the tempering step. Therefore, not only is it possible to dispense with an energy-intensive heating of the substrate in a furnace or controlled cooling by means of a subsequent cooling section, but the substrate remains at room temperature during the RTP and, as a result, can immediately be processed further. Overall, the RTP enables a significantly higher throughput since the process lasts for a period of significantly less than one second. Moreover, it is possible to dispense with high-priced installation components such as, for example, ceramic rollers for transporting hot glass panes in a furnace.

According to the invention, then, the electromagnetic irradiation of the low-e layer is carried out by a flash lamp arrangement having at least one flash lamp, preferably a plurality of flash lamps, by means of at least one flash pulse. A xenon flash lamp is advantageously used as the flash lamp. Xenon flash lamps emit a versatile broadband spectrum, with technically usable wavelengths of typically 160 nm-1000 nm. The noble gas xenon produces the desired spectrum without harmful additions such as mercury, which also turns the method into an environmentally friendly solution. The lower limit of the emission of light of 160 nm is limited by the quartz glass used in the flash lamps. Other types of glass such as lithium fluoride also allow emission wavelengths of below 160 nm, use of this material being dispensed with for cost reasons. Above 1000 nm, the intensity of the emitted light is negligibly low with regard to a technical use.

The advantage of the use of a flash lamp consists in the relatively low costs and the possibility of adapting operation by means of setting the current density to the layer system. A considerable UV component is also generated by operating the flash lamps with high current densities Preferably, the coated layer is irradiated from the side of the layer system, in order to avoid absorption of the electromagnetic radiation for brief tempering, in particular in the UV range, by the substrate and thus heating of the substrate. That results in a substrate which is processable and conventionally configurable.

In one advantageous embodiment of the invention, the low-emissivity layer is thermally treated in the tempering step at an emission wavelength of the electromagnetic radiation in the range of 160 nm to 1000 nm, advantageously at an emission wavelength of the electromagnetic radiation in the range of 200 nm to 500 nm and/or in the range of 500 nm to 950 nm. In this case, the tempering of the low-emissivity layer is preferably carried out in the range of the emission wavelength of the electromagnetic radiation of 200 nm to 400 nm and/or 650 nm to 850 nm and/or 160 nm to 200 nm. The radiation of flash lamps also encompasses emission wavelengths down to 160 nm.

These emission wavelength ranges of the electromagnetic radiation encompass the ranges of the absorption maxima of the low-emissivity layer, which are in the range of approximately 200 nm to 400 nm and 650 to 850 nm. The thermal treatment of the coated low-emissivity layer by irradiation with light in these wavelength ranges makes it possible to reduce the emissivity and/or the sheet resistance in comparison with the low-emissivity layer before the brief tempering step. In this case, the range of 200 nm to less than 400 nm is advantageous since in this range the low-e layer absorbs significantly more radiation, by up to a factor of two, than in the range of 650 nm to 850 nm. It is thereby possible to achieve activation with lower power densities. The range of 200 nm to less than 400 nm can likewise be implemented better from a technological standpoint.

Preferably, the electromagnetic radiation for the tempering step is set in such a way that the deposited layer will receive or absorb a predefinable energy input in the irradiation region. A predefinable final temperature of the low-emissivity layer in the irradiation region is achieved as a result of the predefinable energy input. In this case, the final temperature corresponds to the temperature of the deposited layer which leads to the annealing of the structural defects that arose either owing to the fluctuations in the coating conditions and/or in the temperature insufficient for the production of stable layers, and which does not cause damage to the deposited layer. The energy input is therefore set taking account of the respective highest possible layer temperature, i.e. maximum temperature of the deposited layers, and depending on the thickness of the layers to be thermally treated. A predefined crystal structure and morphology of the deposited low-e layer is thus possible as a result.

The energy input of the irradiation is preferably set taking account both of the parameters of the electromagnetic radiation and of the temperature of the deposited layer, or from the temperature of the deposited layer or of the deposited layer system and of the substrate. For this purpose, one preferred embodiment of the method provides for a measurement of the temperature of the low-e layer or of the low-e layer and of the substrate to be carried out directly before the brief tempering step. On the basis of the measured temperature, the value of the energy input for the thermal aftertreatment is determined and adapted such that a predefinable final temperature for the brief tempering step is obtained. In this case, the energy input is chosen and coordinated with the respective highest possible layer temperature, i.e. maximum temperature of the layers, in such a way that the brief tempering step does not cause any damage to the deposited layer, but rather achieves predefinable or optimum layer properties. That is to say that the energy input is set in such a way that it does not exceed the highest possible layer temperature of the deposited layer. This is particularly important during irradiation of an emission wavelength of the radiation in or near the UV range. In this wavelength range, the radiation is also absorbed well by the substrate, for example composed of glass, which can result in heating of the substrate. By taking account of the temperature of the substrate and the wavelength of the radiation upon setting the energy input of the radiation, it is possible to minimize the heating of the substrate when setting the layer properties of the deposited layer. The low-e layers treated in this way in the brief tempering step afford the advantage of increased reflection in the infrared range of light and hence a reduced emissivity.

In one advantageous embodiment of the invention, a process parameter, such as, for example, the energy density, i.e. power, area of action and time duration of the electromagnetic radiation, for controlling the brief tempering step is determined from the determined energy input. That means that by adapting the electromagnetic radiation in the brief tempering step, in particular by adapting the flash pulses with regard to their pulse shape, pulse time duration, number of pulses, wavelength or current density, it is possible to implement the energy density and thus the optimum layer optimization of low-e layer systems. Advantageously, the flash pulses have a duration of 0.05 ms to 20 ms and a pulse energy density in the range of 1 $J/cm^2$ to 10 $J/cm^2$. It is advantageous that the pulse intensity, the pulse repetition frequency, the pulse shape and the pulse duration of successive flash pulses are varied depending on the thickness of the layers to be thermally treated and taking account of the thermal conduction of the substrate. In one preferred embodiment of the invention, the flash lamp is operated at a current density of greater than 4000 $A/cm^2$, without changing the described energy densities of the light emission in comparison with lower current densities. This can be realized either by smaller lamp diameters or by shorter flash times. At current densities of more than 4000 $A/cm^2$, a pronounced UV component can be generated since the maximum of the emission spectrum of the flash lamp shifts toward shorter wavelengths as the current density increases. Since, for the order of magnitude of the current density, a life expectancy of flash lamps is approximately $10^6$-$10$ flashes, a large number of substrates can be tempered before a lamp is changed. High-power flash lamps are operated at 500 Hz, for example, with the result that the throughput in production installations is not restricted by the RTP, but rather by the maximum transport speed of substrates or the coating of the substrates.

In accordance with one advantageous embodiment of the invention, at least one low-e layer contains silver or consists thereof. Thin silver films in a wetted configuration are transparent in the solar and/or visible spectral range and at the same time highly reflective in the infrared wavelength range. In the production method, conventionally, thin silver layers usually cannot be deposited ideally conformally and tend toward dewetting. This results in a corrugated, not ideally uniform layer thickness distribution, which is highly disadvantageous for thermally insulating coatings. Whole-area wetting and thus smoothing of the silver layers takes place as a result of the subsequent thermal treatment of the layer in the brief tempering step by means of electromagnetic radiation on account of the diffusion processes caused by the temperature increase.

It is conceivable, however, that the low-emissivity layer comprises or consists of other materials, provided that the latter have a low thermal emissivity—deemed to be acceptable for low-e layer systems—in the infrared range in conjunction with a high transmittance in the visible spectrum.

In accordance with one advantageous embodiment of the invention, the substrate is composed of glass as the principally used substrate of low-e layer systems. Its high absorption in the IR range becomes less important on account of the process implementation as brief tempering with limitation and, if appropriate, with monitoring of the layer temperature and thus substrate temperature.

In a further advantageous embodiment of the invention, the method comprises, in the step of forming at least one low-emissivity layer, a plurality of layers for forming a low-emissivity layer system. In this case, the layers can be thermally treated by means of electromagnetic radiation in the brief tempering step of the low-emissivity layer or/and in a further brief tempering step. Preferably, the low-emissivity layer comprises at least two dielectric layers. A low-e silver layer is preferably arranged between at least two dielectric layers.

In one advantageous embodiment of the invention, both the coating and the brief tempering step of the deposited low-e layer are carried out by means of electromagnetic radiation in an inline vacuum coating installation. With regard to the present invention, an "inline process implementation" means that the substrate is physically transported from a coating station to the further processing station, in order to be able to apply and treat layers, the substrate also being transported further during the coating process and/or flash lamp irradiation. In this case, the substrate is preferably moved at a transport speed such that it does not heat up all that much. The method can be operated in continuous installations with a continuously transporting substrate belt, either an endless substrate and roll-to-roll coating or a quasi-continuous sequence of synchronously moved, successive planar package-type substrates.

In one advantageous embodiment of the method, the brief tempering step is carried out in situ after the layer deposition of the substrate in the same treatment chamber.

In a further advantageous embodiment of a method, a further layer deposition is performed after the thermal treatment of the low-e layer. Preferably, a further thermal aftertreatment is performed after the or each further low-e layer deposition. In this case, the energy input is adapted during the thermal aftertreatment in such a way that a predefinable final temperature of the low-e layer to be treated is obtained.

The method according to the invention is thus more energy-efficient and associated with fewer breaking losses in comparison with conventional convection furnaces. The color shift achieved by the method in the low-emissivity layer system is congruent with the values observed for conventional tempering, which equalizes optical differences and enables parallel mounting of both panes.

In terms of the device, the object on which the invention is based is also achieved by means of the features of claim 10. Further embodiments of the invention are evident from the associated dependent claims.

According to the invention, the device for carrying out the method according to the invention comprises a flash lamp arrangement for briefly tempering the low-e layer system. In this case, the flash lamp arrangement has at least one flash lamp, preferably a xenon lamp. Installations for the RTP of large areas in conjunction with high throughput, e.g. greater than 40 m²/min, can be constructed cost-effectively with flash lamps.

In one advantageous embodiment of the invention, the flash lamp arrangement comprises a beam shaping unit, for example a diaphragm or a mirror system, for generating a linear intensity distribution of the electromagnetic radiation, which advantageously runs perpendicular to the transport direction of the substrate. In this case, the length of the linear intensity distribution of the electromagnetic radiation for brief tempering corresponds at least to the width of the layer deposited on the substrate in the direction of the longitudinal extent of the linear intensity distribution of the electromagnetic radiation. As a result, regions of the low-emissivity layer system in the longitudinal extent of the linear intensity distribution are simultaneously briefly irradiated and cooled, which leads to a homogeneous structuring of the low-e coating in the irradiated region.

BRIEF DESCRIPTION OF DRAWING FIGURES

The invention will be explained in greater detail below on the basis of the exemplary embodiment. In the associated drawings:

FIG. 1 shows a schematic illustration of the installation system for combined coating and subsequent thermal treatment by means of a flash lamp arrangement;

FIG. 2 shows transmission (Trans) and reflection (Refl) spectra, measured from the glass or layer side, in each case before (untreated) and after the thermal treatment of the low-e layer by means of the flash lamp arrangement.

DETAILED DESCRIPTION

The specific process steps and apparatuses described in detail below should be understood merely as illustrative examples. Therefore, the invention is not restricted to the process parameters, apparatuses and materials mentioned here.

FIG. 1 shows the schematic construction of the installation system 1 for combined coating and subsequent thermal treatment by means of a flash lamp arrangement. It consists of a longitudinally extended vacuum installation 1 comprising a substrate transport system 11, by means of which the large-area substrates 10 are moved through in a transport direction below various processing stations, inter alia coating modules 30. In a coating module 30, a low-e layer system 20 comprising at least one low-e layer is applied to the substrate 10. A plurality of low-e layers are also conceivable.

After coating has been carried out, the substrate 10 provided with the layer system 20 is brought into a position for treatment by the flash lamp arrangement 50. In this case, the flash lamp arrangement comprises a plurality of flash lamps 53, in particular xenon lamps. The flash lamp arrangement 50 consists of a mirror system 52, which, by virtue of a suitable arrangement and geometry, projects the light of the flash lamps homogeneously onto the substrate 10 provided with the low-e layer system 20 from the layer side. A quartz glass sheet 51 separates the flash lamp arrangement 50 from the actual vacuum process chamber. After the thermal treatment has been carried out, the deposited substrate 10 can subsequently be transported to a further processing station 31 or the thermal treatment can be repeated.

Optionally, the installation 1 has a regulation 41 of the energy input of the tempering of the low-e layer system. In this case, the regulating variable corresponds to an energy input required for obtaining a predefinable final temperature of the low-e layer system in the subsequent step of thermal treatment. In this case, it is necessary to attain the final temperature of the deposited layer system 20 within specific limits, by carrying out a setting and thus the improvement of its layer properties, such as, for example, transmission, reflection and resistance, rather than a destruction of the structure, such as embrittlement, caused on account of the maximum temperature of the deposited layer being exceeded.

In this regard, the setting of the energy input of the irradiation can be carried out taking account both of the parameters of the electromagnetic radiation of the flash lamp device such as its wavelength, energy density and area of action, and of the temperature of the deposited layer, or from the temperature of the deposited layer or of the deposited layer system and of the substrate. For this purpose, an arrangement of the temperature measuring means 40 in the installation 1 and a temperature measurement before the brief tempering step are conceivable.

The determined value of the energy input is communicated to the flash lamp device 50 via the control device 41 and serves as a regulating variable for determining the parameters of the brief tempering step and for carrying out the subsequent brief tempering step. That means that the parameters of the brief tempering step, such as wavelength, duration, type and manner of the electromagnetic radiation, are adapted in such a way that the layer system to be treated receives the determined energy input and, as a result, the low-e layer attains the predefinable final temperature.

Exemplary Embodiment

A glass substrate having dimensions of 10×10 cm² is introduced into a vacuum chamber and coated with a temperable double-low-e (DLE) layer stack having a silver layer between two dielectric cover layers. The sample constitutes a commercially available layer system. In order to improve the optical properties, the low-e layer stack is irradiated by a xenon lamp device and an energy density of the irradiation of 2 J/cm². The sheet resistance of the low-e layer stack before and after irradiation is determined by means of an eddy current measuring unit, since contact cannot be made directly with the silver layer through the dielectric cover layers. The irradiation of the low-e layer stack results in a reduction of the sheet resistance of the low-e layer from 6 ohms square (see reflection spectrum in FIG. 2) to 3 ohms square. The reduction of the sheet resistance indicates a densification and homogenization of the silver layer, which constitutes the characteristic feature of the expected improvement in the emissivity.

FIG. 2 illustrates the respective transmission and reflection spectra of the sample. In this case, the formulation "Trans" corresponds to the transmission spectrum of the sample before (untreated) and after the irradiation, and the formulation "Refl" corresponds to the reflection spectrum measured from the layer side before (untreated) and after the irradiation. The comparison of the given spectra reveals, for the thermally treated sample, a significant increase in the transmission in the visible spectral range and an advantageous higher reflection in the infrared wavelength range.

The invention claimed is:

1. A method for producing a low-emissivity layer system, comprising the steps of: forming at least one transparent metallic IR reflection layer on at least one side of a substrate by deposition, and subsequently tempering the at least one transparent metallic IR reflection layer by rapid thermal processing (RTP) with electromagnetic radiation having an emission wavelength range encompassing a range of absorption maxima of the at least one transparent metallic IR reflection layer without heating of the substrate, wherein the electromagnetic radiation is set to achieve a predefined final temperature of the at least one transparent metallic IR reflection layer which anneals structural defects in the at least one transparent metallic IR reflection layer without damaging the at least one transparent metallic IR reflection layer, wherein the electromagnetic radiation is effected by a flash lamp arrangement having at least one flash lamp by at least one flash pulse and wherein the tempering decreases sheet resistance and heat emissivity, and increases transmission in the visible range and reflection of infrared by the at least one transparent metallic IR reflection layer.

2. The method as claimed in claim 1, wherein a xenon flash lamp is used as the flash lamp.

3. The method as claimed in claim 1, wherein the flash lamp is operated at a current density of greater than 4000 A/cm$^2$.

4. The method as claimed in claim 1, wherein duration of each flash pulse is set in the range of between 0.05 and 20 ms.

5. The method as claimed in claim 1, wherein the electromagnetic radiation for the tempering is set in such a way that the at least one transparent metallic IR reflection layer receives a predefined energy input in an irradiation region.

6. The method as claimed in claim 1, wherein the at least one transparent metallic IR reflection layer comprises silver.

7. The method as claimed in claim 1, wherein, forming of the at least one transparent metallic IR reflection layer comprises forming a plurality of layers of the low-emissivity layer system.

8. The method as claimed in claim 1, wherein the low-emissivity layer system comprises at least two dielectric layers.

9. The method as claimed in claim 1, carried out in an inline vacuum coating installation.

10. The method as claimed in claim 1, wherein the flash lamp arrangement comprises a plurality of flash lamps.

11. The method as claimed in claim 1, wherein the at least one transparent metallic IR reflection layer consists of silver.

12. The method as claimed in claim 6, wherein; forming of the at least one transparent metallic IR reflection layer comprises forming a plurality of layers of the low-emissivity layer system.

13. The method as claimed in claim 6, wherein the low-emissivity layer system comprises at least two dielectric layers.

14. The method as claimed in claim 6, carried out in an inline vacuum coating installation.

15. The method as claimed in claim 1, further comprising: taking a temperature measurement of the at least one transparent metallic IR reflection layer or the at least one transparent metallic IR reflection layer and the substrate, before tempering and, based on the temperature measurement, determining and adapting a value of energy input into the at least one transparent metallic IR reflection layer from the electromagnetic radiation to achieve the predefined final temperature during tempering.

* * * * *